US012613268B2

(12) United States Patent
Wagner et al.

(10) Patent No.: US 12,613,268 B2
(45) Date of Patent: Apr. 28, 2026

(54) INSULATION INSPECTION SYSTEM WITH VOLTAGE AND CURRENT BALANCING CIRCUIT

(71) Applicant: GM GLOBAL TECHNOLOGY OPERATIONS LLC, Detroit, MI (US)

(72) Inventors: Sean Robert Wagner, Shelby Township, MI (US); John S. Agapiou, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 145 days.

(21) Appl. No.: 18/428,537

(22) Filed: Jan. 31, 2024

(65) Prior Publication Data

US 2025/0244376 A1 Jul. 31, 2025

(51) Int. Cl.
G01R 31/12 (2020.01)

(52) U.S. Cl.
CPC ................................. G01R 31/1263 (2013.01)

(58) Field of Classification Search
CPC ...... G01R 31/346; G01R 31/52; G01R 31/34;
G01R 31/1272; G01R 31/00; G01R
31/50; G01R 31/1245; G01R 31/54;
G01R 31/12; G01R 31/58; G01R 31/72;
G01R 19/165; G01R 31/007; G01R
31/08; H02K 11/30; H02K 3/28; H02K
29/06; H02K 99/20; H02K 11/02; H02K
11/05; H02K 3/30; H02K 5/08; H02P
29/027; H02P 29/0243; H02P 6/14; H02P
29/0241; H02P 6/16; H02P 25/16; H02P
29/032; H02P 29/024; G06F 3/044
See application file for complete search history.

(56) References Cited

U.S. PATENT DOCUMENTS

| | | | | | |
|---|---|---|---|---|---|
| 5,514,967 | A | * | 5/1996 | Zelm | .................. G01R 31/1227 324/765.01 |
| 6,806,719 | B2 | * | 10/2004 | Awaji | ....................... H04B 3/54 324/544 |
| 7,034,706 | B1 | | 4/2006 | Nippes | |
| 7,042,229 | B2 | * | 5/2006 | Lee | ......................... H01H 31/12 361/23 |
| 8,354,817 | B2 | * | 1/2013 | Yeh | ...................... G01R 31/343 318/727 |

(Continued)

FOREIGN PATENT DOCUMENTS

DE 102014107025 A1 12/2014

OTHER PUBLICATIONS

German Office Action from counterpart DE1020241075953, dated Dec. 16, 2024.

(Continued)

*Primary Examiner* — Vinh P Nguyen

(57) ABSTRACT

An insulation inspection system includes: a set of input terminals; a brush; a circuit connected to the set of input terminals, the brush, and a part being inspected, where the circuit includes at least one pair of resistors and a capacitor; and a control module configured to detect when a short circuit exists between a conductive element of the part and one or more conductive bristles due to insulative material missing on the part and as a result the one or more conductive bristles of the brush contacting the conductive element of the part.

20 Claims, 4 Drawing Sheets

(56)                References Cited

U.S. PATENT DOCUMENTS

| | | | | |
|---|---|---|---|---|
| 9,018,881 | B2 * | 4/2015 | Mao | H02P 29/0241 |
| | | | | 318/696 |
| 9,476,944 | B2 * | 10/2016 | Perry | H02K 15/00 |
| 10,132,854 | B2 * | 11/2018 | Dang | G01R 31/1272 |
| 11,569,712 | B2 | 1/2023 | Mukherjee et al. | |
| 2012/0206162 | A1 | 8/2012 | Leonov | |
| 2014/0368233 | A1 | 12/2014 | Perry et al. | |
| 2018/0088168 | A1 | 3/2018 | Dang | |

OTHER PUBLICATIONS

German Office Action from counterpart DE1020241090952, dated Feb. 6, 2025.
"Flexible Brush Handle Design for Insulation Inspection," disclosed anonymously, Questel Research Disclosure, The Industry Standard Disclosure Publication Service, www.researchdisclosure.com, published digitally Mar. 23, 2023.

* cited by examiner

INSULATION INSPECTION SYSTEM WITH VOLTAGE AND CURRENT BALANCING CIRCUIT

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to continuity testing systems, and more particularly, to insulation inspection systems for inspecting stator windings and other electrical components.

Electric vehicles and hybrid vehicles include traction motors for propulsion purposes. Each of the traction motors includes a stator and a rotor having corresponding windings and conductive bars. The windings and/or conductive bars may be insulated (e.g., have an outer insulative coating). During manufacturing, including part and component formation and assembly, the insulative coatings may not be formed properly or may be nicked, scratched, rubbed, etc. This can result in portions of the insulative coatings being absent and/or removed thereby exposing electrically conductive elements. This exposure can result in a short circuit, affect motor performance, and/or reduce life of the motor.

SUMMARY

An insulation inspection system is disclosed and includes: a set of input terminals; a brush; a circuit connected to the set of input terminals, the brush, and a part being inspected, where the circuit includes at least one pair of resistors and a capacitor; and a control module configured to detect when a short circuit exists between a conductive element of the part and one or more conductive bristles due to insulative material missing on the part and as a result the one or more conductive bristles of the brush contacting the conductive element of the part.

In other features, the set of input terminals includes a positive terminal and a negative terminal. The capacitor and a first resistor of the pair of resistors is connected in series between the positive terminal and the negative terminal.

In other features, the set of terminals includes a common terminal separate from the positive terminal and the negative terminal. A second resistor of the pair of resistors is connected between the negative terminal and the common terminal.

In other features, the set of terminals includes a positive terminal, a negative terminal and a common terminal. The circuit is implemented as a voltage and current balancing circuit and includes the pair of resistors and the capacitor connected in series between the positive terminal and the common terminal. A first resistor of the pair of resistors and the capacitor are connected in series between the positive terminal and the negative terminal. A second resistor of the pair of resistors is connected between the negative terminal and the common terminal.

In other features, the capacitor is connected across a power source and between the positive terminal and the negative terminal.

In other features, the first resistor includes i) a first end connected to a first end of the capacitor, and ii) a second end connected to a first one of the set of input terminals and to the brush. The second resistor includes i) a first end connected to a second one of the set of input terminals, to a second end of the capacitor, and to the part, and ii) a second end connected to a third one of the set of input terminals.

In other features, the first end of the capacitor is connected to a positive terminal of the power source. The second end of the capacitor is connected to a negative terminal of the power source.

In other features, a lead is connected between i) the second one of the set on input terminals, the first end of the second resistor and the second end of the capacitor, and ii) one or more 3-phase contacts of the part.

In other features, the insulation inspection system further includes an analog-to-digital converter connected to the circuit and configured to convert an analog signal output from the circuit to a digital signal. The control module is configured, based on the digital signal, to detect when a short circuit exists between the conductive element of the part and the one or more conductive bristles.

In other features, the control module is configured to generate at least one of a message or an alarm when a short circuit between the conductive element of the part and the one or more conductive bristles is detected.

In other features, an insulation inspection method is disclosed and includes: connecting a lead to a part to be inspected; moving a brush across a portion of the part or moving the part relative to the brush; detecting via a circuit a drop in voltage across a pair of input terminals, where the circuit is connected to the pair of input terminals, the brush, and the part, and where the circuit includes at least one of a pair of resistors and a capacitor; and determining whether the drop in voltage is indicative of when a short circuit exists between a conductive element of the part and one or more conductive bristles of the brush due to insulative material missing on the part and as a result the one or more conductive bristles of the brush contacting the conductive element of the part.

In other features, the set of input terminals includes a positive terminal and a negative terminal. The capacitor and a first resistor of the pair of resistors is connected in series between the positive terminal and the negative terminal.

In other features, the set of terminals includes a common terminal separate from the positive terminal and the negative terminal. A second resistor of the pair of resistor is connected between the negative terminal and the common terminal.

In other features, the set of terminals includes a positive terminal, a negative terminal and a common terminal. The circuit is implemented as a voltage and current balancing circuit and includes the pair of resistors and the capacitor connected in series between the positive terminal and the common terminal. A first resistor of the pair of resistors and the capacitor are connected in series between the positive terminal and the negative terminal. A second resistor of the pair of resistors is connected between the negative terminal and the common terminal.

In other features, the capacitor is connected across a power source and between the positive terminal and the negative terminal.

In other features, the pair of resistors includes a first resistor and a second resistor. The first resistor includes i) a first end connected to a first end of the capacitor, and ii) a second end connected to a first one of the set of input terminals and to the brush. The second resistor includes i) a first end connected to a second one of the set of input terminals, to a second end of the capacitor, and to the part, and ii) a second end connected to a third one of the set of input terminals.

In other features, the first end of the capacitor is connected to a positive terminal of a power source. The second end of the capacitor is connected to a negative terminal of the power source.

In other features, a lead is connected between i) the second one of the set of input terminals, the first end of the second resistor and the second end of the capacitor, and ii) one or more 3-phase contacts of the part.

In other features, the insulation inspection method further includes: converting an analog signal output from the circuit to a digital signal via an analog-to-digital converter, where the analog-to-digital converter is connected to the circuit; and based on the digital signal, detecting when a short circuit exists between the conductive element of the part and the one or more conductive bristles.

In other features, the insulation inspection method further includes generating at least one of a message or an alarm when a short circuit between the conductive element of the part and the one or more conductive bristles is detected.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

During manufacturing, motors may be inspected to detect defects such as defects in insulative coatings of electrical elements of a stator. The insulative coatings may be visually inspected. This may include a quality control technician using a magnifying glass to visually inspect for defects in the insulative coatings of the stator. Such an inspection is labor intensive and is subject to limitations of the technician. A continuity tester may be used that applies a voltage to the stator and detects when a short circuit exists. Electrical current flows between the stator and the continuity tester when there is a lack of insulative material at the where the tester contacts the stator.

The continuity tester may include a brush that includes conductive bristles. The bristles may be moved across and brush various portions of the stator to detect short circuit locations (i.e., defect locations) where there is a lack of insulative material. The opposite may also occur where the part (or stator) is moved through the bristles and the brush is stationary. A circuit is used to monitor changes in a voltage at the brush. The voltage drops off substantially when a short circuit occurs. There are large swings in voltage and current between when no short exists and when a short does exist.

Large voltage and current swings in the circuit can be detrimental to components over time if not managed properly. Thus, the components can degrade over time and as a result this degradation can negatively affect operation of the circuit. For example, an A/D converter may have specific voltage and current restrictions for operation based on what is used. If there is any resulting drift in circuit components such as in resistors or other circuit components, this can result in voltage response behaviors that can cause issues with voltage threshold setting and not appropriately detecting a short. The degradation of the circuit components can cause drift in the voltage, which can result in subsequent defects going undetected. The drift thus requires circuit adjustments and periodic recalibrating including adjustments in a threshold value. A defect may be detected when the voltage drops below the threshold value. As an example, the threshold value may be set at 5 volts (V), which is significantly lower than a nominal and/or normally expected voltage (e.g., 24V). The threshold value may be set at less than or equal to 20% of the nominal voltage.

The drift can also result in unsafe current levels. If circuit components degrade over time and a resulting change in expected current of the circuit occurs, this can lead to current levels in the circuit that can exceed a threshold for perceived and/or actual bodily harm. In addition, higher than expected current levels can also be detrimental to parts and the brush even when human exposure is mitigated.

Figure 2:
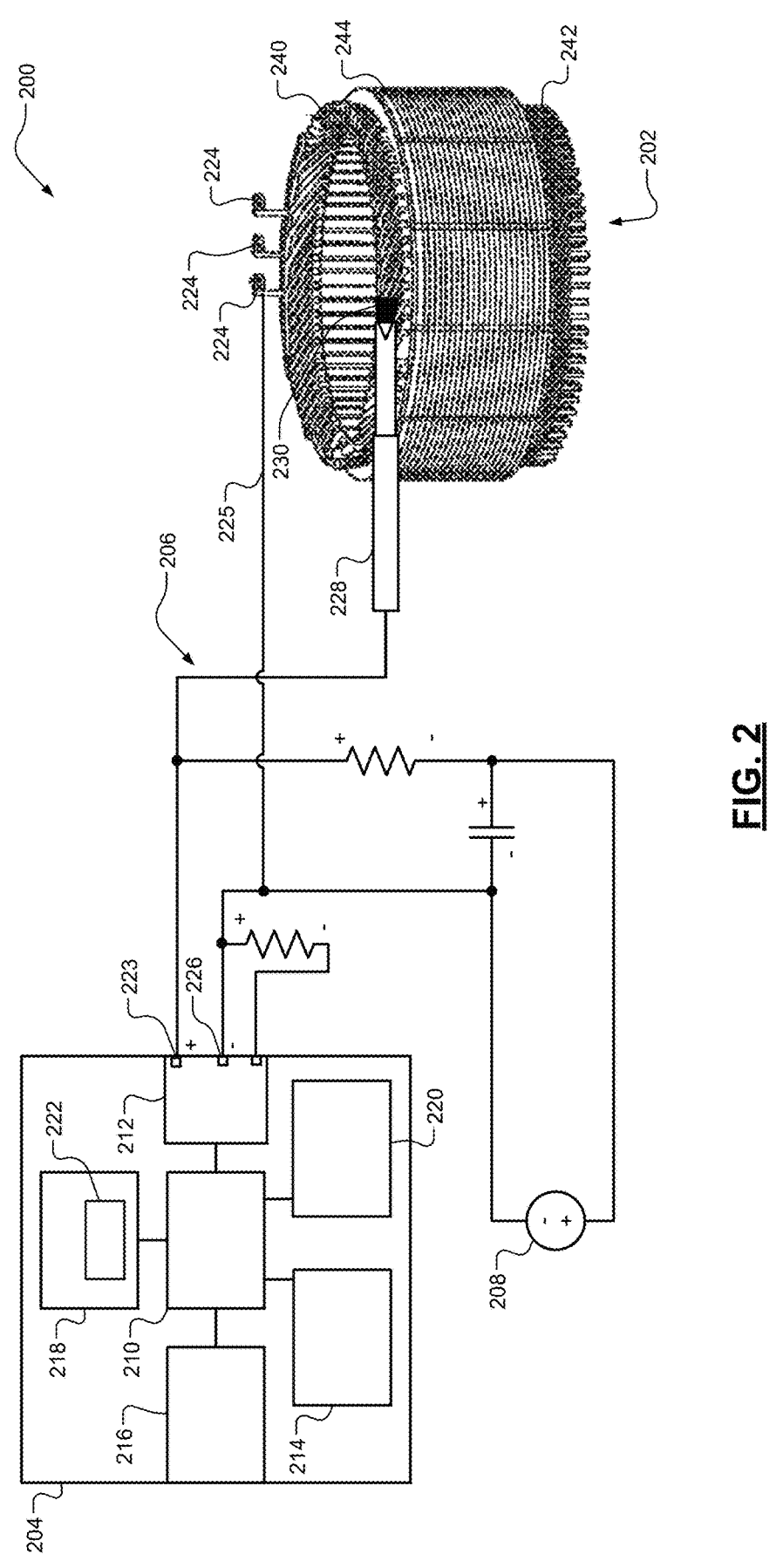
FIG. 2 is a schematic view of an example insulation inspection system inspecting a stator and including a voltage and current balancing circuit in accordance with the present disclosure.
Figure 3:
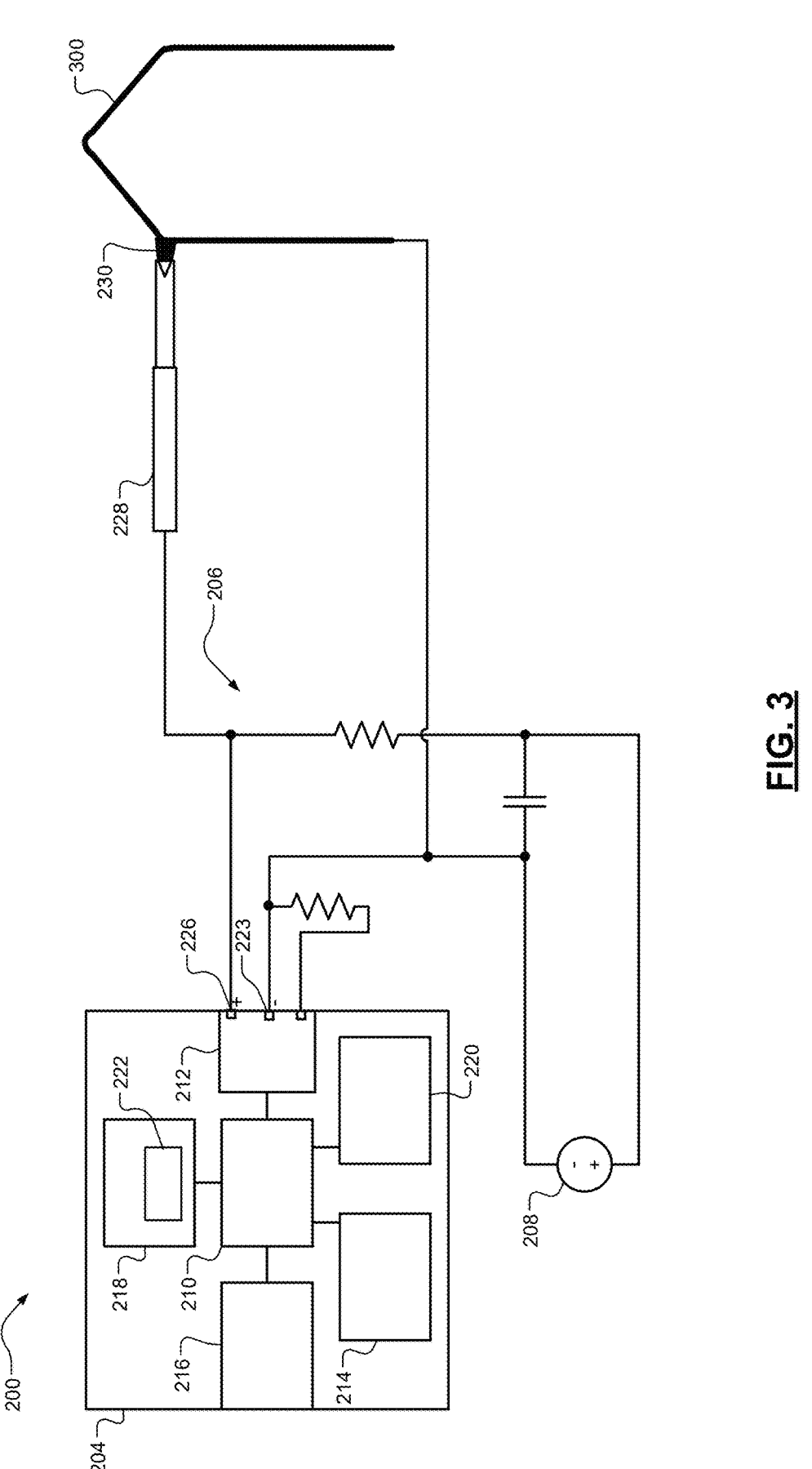
FIG. 3 is a schematic view of the insulation inspection system of FIG. 2 inspecting an individual hairpin of a stator in accordance with the present disclosure.

The examples set forth herein include an insulation inspection system having a voltage and current balancing circuit, as shown in FIGS. 2-3. The voltage and current balancing circuit provides a balanced voltage response at a nominal low current that is detected via bristles of a continuity testing brush used to detect a defect (or short). The voltage and current balancing provides stability, improves longevity of circuit components, and provides improved functionality allowing for use of the insulation inspection system in various applications while being human touch safe. The insulation inspection system, in addition to the stated hardware, further includes an algorithm for flagging defective parts. The algorithm improves sensitivity for better detection of defects.

The voltage and current balancing circuit improves flexibility in safety by incorporating a capacitor for voltage distribution and resistors R1 and R2 of appropriate size. The resistors R1 and R2 are selected to generate a low current response. The capacitor and resistors are connected across common, negative and positive terminals of an analog-to-digital (A/D) converter. The values of the resistors R1 and R2 are selected to generate a low current response during throughout operation and/or at all points of operation of the voltage and current balancing circuit. The low current response makes the test setup safe for an operator. The capacitor produces an open-circuit condition when an electrical short does not exist. When a short is detected using a brush (e.g., a brush having carbon bristles), a voltage at a positive end of the capacitor drops, which results in some drop in voltage across the resistors R1 and R2 such that voltages of each positive and negative terminal of the A/D converter remains within a predetermined voltage range (e.g., ±13V) relative to a voltage on the A/D common terminal.

The selection of the resistors R1 and R2 is done such that the current throughout the voltage and current balancing circuit when there is a short is maintained below a predetermined current (e.g., less than or equal to 25 mA, which is not perceptible by human contact). From an incoming analog voltage signal standpoint, this would have the positive terminal of the A/D converter maintained at the nominal operating voltage (e.g., 24 V) and the negative terminal of the A/D converter maintained at 0 V when no short is present. When a break in insulation occurs, i.e., the brush to phase lead connection is shorted, the following changes occur in the voltage and current balancing circuit. The positive A/D terminal is forced towards 0V. It is worth noting that the positive A/D terminal may not fully reach 0V due to intermittent contact between the brush bristles but in the case of a solid short being formed the positive A/D terminal is forced to 0V. A defect is detected when the positive A/D terminal drops to or below a predetermined threshold (e.g., 5V) or lower compared with the base or no short nominal voltage (e.g., 24V).

Since the negative A/D terminal is maintained at 0V, there is a 0V difference between the positive and negative A/D terminals, and by consequence the common A/D terminal is at 0V as well. Because of this, resistor R2 connected across the negative and common A/D terminals experiences a 0V drop (no current flow).

When a defect is detected, the capacitor will have charge available to discharge as needed rather than having a power source, supplying the nominal voltage, be directly connected to the short (or defect). This allows for a constant voltage drop of the capacitor to be maintained while minimizing an amount of current flow in any branch of the voltage and current balancing circuit as the corresponding brush makes intermittent contact with the defect. This is done by maintaining a resistor-capacitor (RC) time constant sufficiently long such that discharge of the capacitor does not cause large swings in a voltage drop across the capacitor over the time duration that intermittent contact is made between the brush and the defected area. As an example, the time constant may be 24 seconds. This results in a resistor R1 being connected between i) the capacitor and ii) the positive A/D terminal and the brush, primarily experiencing the voltage drop when a short condition occurs.

To make certain that current in the circuit does not exceed something that the human body would be able to perceive, resistor R1 is selected such that when a short exists the current will not exceed a threshold (e.g., 1 milli-ampere (mA)). This voltage and current balancing at all points of operation is what allows the entire voltage and current balancing circuit to be safe for human touch as well as not introduce current or voltage levels that would damage either brush bristles or a part being inspected. The current and voltage levels remain below predetermined thresholds to prevent, for example, arcing.

When a short exists, the capacitor may be discharged at an appropriate rate for rapid stable measurement. Current flows through the resistors and provides an analog voltage measurement for the A/D converter. Once the brush is removed from the defect and a short circuit no longer exists, the capacitor is charged until it is back in an open-circuit state.

The voltage and current balancing circuit prevent deterioration of circuit components by preventing large swings in voltage and current across circuit components in the event of a short. The values of the capacitor and resistors are selected for improved circuit performance and to prevent circuit component deterioration due to parasitic voltages across the resistors. The values are selected to prevent drifting of circuit component values. This prevents larger than expected voltage drops and arcing across bristles of the brush.

Figure 1:
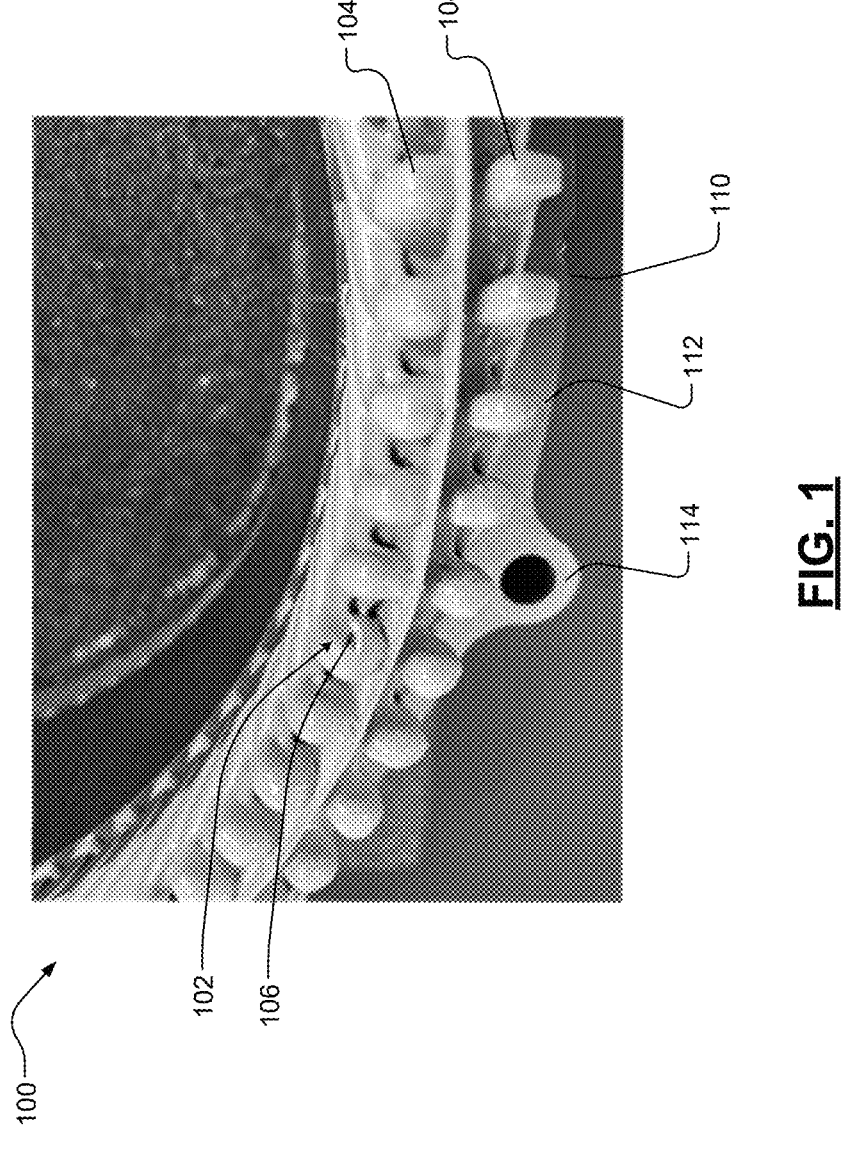
FIG. 1 is a bottom view of a portion of a stator illustrating an example defect in an insulative coating.

FIG. 1 shows a portion 100 of a stator. The stator includes welded wire pairs that are coated in insulative material. The portion 100 includes a defect 102 where a portion of the insulative coating 104 is missing and conductive material 106 of a wire is exposed. In FIG. 1 a bottom (or welded end) of the stator is shown. The stator includes a laminated stack (or body) 110 having a bottom face 112 and multiple ears (one ear 114 is shown in FIG. 1). As an example, the insulative coating 104 may be epoxy.

FIG. 2 shows an insulation inspection system 200 inspecting a stator 202. The insulation inspection system 200 includes a human machine interface (HMI) 204 and a voltage and current balancing circuit 206, which is connected to a power source 208. The HMI 204 may include a control module 210, an A/D converter 212, a memory 214, a transceiver 216, a display 218, and an audible device 220. The display 218 includes LEDs 222 and/or other visual display and/or indicator elements. The control module 210 receives digital voltage data from the A/D converter 212, which receives an analog input signal from the voltage and current balancing circuit 206. The control module 210 detects defects when the analog output signal across positive and negative terminals 223, 226 (or corresponding digital signal) of the A/D converter 212 drops in voltage below the threshold (e.g., 5V or 20% of nominal or normal expected voltage (e.g., 24V)). The normal expected voltage with no detected defect may be 24V. The control module 210 may indicate detection of defects via the display 218 and audible device 220. Detection of a defect, the change (or drop) in voltage, the timing of the detection, and/or other related information may be stored in the memory 214. As an example, the detection of the defect may be stored along with a proximate location of the defect relative to one or more reference points on the stator 202.

The display 218 provides a visual aid for indicating detection of a defect. This provides an indication also of when a defect is detected. The audible device 220 may provide a loud sound such as a loud alarm signal when a defect is detected. The audible device 220 may include, for example, a speaker. The control module 210 may report detected defects and corresponding information stored in the memory 214 to one or more network devices remotely located from the HMI 204 via the transceiver 216.

The voltage and current balancing circuit 206 includes resistors R1, R2 and a capacitor C. Resistor R1 has i) a first end connected to a first (or positive) terminal of the A/D converter 212 and to the brush 228, and ii) a second end connected to a first end of the capacitor C and to a positive terminal of the power source 208. Resistor R2 includes i) a first end connected to second (or negative) input terminal 226 of the A/D converter 212, to a second end of the capacitor, one or more of the 3-phase contacts 224, and a negative terminal of the power source 208, and ii) a second end connected to a third (or common) terminal COM of the A/D converter 212. The common terminal COM is separate from and not connected to either of the terminals 223, 226. A lead 225 is connected between i) the negative terminal 226, the first end of resistor R2 and the second end of capacitor C, and ii) the one or more 3-phase contacts 224. The first end of the capacitor C is connected to the positive terminal of the power source 208. A second end of capacitor C is connected to the negative terminal of the power source 208.

The resistors R1, R2 and the capacitor C are connected in series between the terminal 223 and the common terminal COM. In the example shown, the capacitor C is connected between the resistors R1 and R2. In an embodiment, the resistors R1 and R2 are directly connected to the terminals 223, 226 and directly connected to the capacitor C. The resistor R1 may be directly connected to the brush 228. The resistor R2 may be directly connected to the stator 202.

As an example, the resistor R1 may be 20-30 kiloohms (kΩ), the resistor R2 may be 400-500 kΩ, and the capacitor may be 500-1500 microfarads (μF). In an embodiment, R1 is 24 kΩ, R2 is 470 kΩ, and C is 1000 μF. The resistances of the resistors and the capacitance of the capacitor are selected to provide the RC time constant referred to herein. In an embodiment, the resistances of the resistors R1, R2 are selected to limit an amount of current flowing through the stator 202, the voltage and current balancing circuit 206, and the brush 228. The resistances of the resistors R1 and R2 and the capacitance of the capacitor C are selected i) to prevent arcing and sparking at the bristles 230 when a defect (short circuit) occurs, and ii) for proper current balancing in the circuit during all test conditions to maintain being safe for human touch (less than 1 mA). For example, the resistances of the resistors R1 and R2 may be selected to prevent the current through the circuit 206, the brush 228 and the stator 202 from exceeding a predetermined threshold.

The resistance values are selected to limit current during all aspects of operation and to balance the voltage load permitted across the channels of the A/D converter 212 such as that associated with the terminals 223, 226. In an embodiment and regardless of whether a defect is present (short occurs) or no defect (no short) is present, the current is maintained between 25 microamperes (uA) and 1 mA due to i) the placement and selected values of resistors R1 and R2 along with the capacitor C in the voltage and current balancing circuit 206 in relation to the power source 208 (e.g., 24 VDC power supply), and ii) A/D voltage channel limits between different channels relative to the A/D common terminal COM. The resistances of R1 and R2 may be changed based on A/D behavior limits to maintain the current behavior described. As an example, the channel limits may be such that the A/D channels of the A/D converter are within ±10-13V of the A/D common terminal COM. In an embodiment, the channel limits are such that the A/D channels are within ±10.2V of the A/D common terminal COM.

The capacitance rating of the capacitor C is selected to provide a sufficiently long RC time constant in conjunction with the R1 value selected for current level reasons. This is done to provide a stable nominal voltage (e.g., stable 24V) to the voltage and current balancing circuit 208 within the time window it takes to determine if a short has occurred. The R1*C value may provide a time constant of approximately 24 seconds. This provides a sufficiently long time constant that does not need to be increased further with a larger C value, however the time constant may be increased further. If the time constant is too small then the charging and discharging behavior of the capacitor C would influence circuit operation in that the nominal voltage would no longer stay at a stable 24V when a defect occurs. This can make it challenging to assign a specific defect detection threshold since the voltage response would become convoluted with the behavior of the capacitor C.

The capacitance of the capacitor C affects a rate of change in current flowing through the stator 202, the voltage and current balancing circuit 206, and the brush 228. The capacitor C is included as a safeguard for the brush 228 and bristles 230 and prevents a surge in current from the power source 208 to the location of the short circuit. When no short circuit exists, the capacitor C is charged. When a short circuit exists, the capacitor C discharges. The capacitor C does not fully discharge due to the RC time constant used. This aids in limiting current in the circuit during a shorting event. After the discharge, the power source 208 recharges the capacitor C. Typically if the bristles are being moved, the short circuit lasts a short period of time. Without the capacitor C, the resistors R1 and R2 may deteriorate due to a short circuit and surge in current through the resistors R1 and R2. The capacitance and resistance values may also be selected based on the application of use to provide a low current draw for safe operator use. For example, the capacitance of the capacitor C and the resistances of the resistors R1, R2 may be selected to accommodate different brush head designs used for detecting defects. In an embodiment, the brush is designed to have a low impedance compared with the circuit components. The insulation inspection system 200 is able to accommodate brushes having various different designs.

The HMI 204 and/or A/D converter 212 detects an analog voltage across the terminals 223, 226. Filtering of the A/D signal is done through data sampling to remove noise associated with electrical behavior of the bristles of the brush. A voltage from the power source 208 is provided across the capacitor C, which provides a stable voltage in conjunction with resistor R1 to the brush 228 and one of the 3-phase contacts 224 of the stator 202 is connected to the lead 225. When one or more of the bristles 230, which are conductive, comes in contact with an exposed conductive element of the stator 202 current flows from one of the 3-phase contacts 224 through the stator 202 and to one or more of the bristles 230 that are in contact with the exposed conductive element. The 3-phase contacts 224 include three contacts; one for each phase of the 3-phase stator 202. In one embodiment, the 3-phase contacts 224 are connected to each other, such that current may flow through any of the phases of the stator 202. In another embodiment, the voltage is provided to one of the 3-phase contacts 224 of the stator 202 and the brush is connected to the lead 225.

The insulation inspection system 200 may be used to inspect a crown end 240 of the stator 202 as shown, a welded end 242, and/or other portion of the stator 202. The insulation inspection system 200 may also be used to inspect individual electrical components and/or elements, an example of which is shown in FIG. 3. The crown end 240 extends upward from a lamination stack 244. The welded end extends downward from the lamination stack 244. The bristles 230 may be moved along different components of the stator 202 to detect locations where insulative material is missing.

The insulation inspection system 200 includes software and hardware with tunable A/D voltage thresholds utilized for flagging defects. As an example, the threshold for flagging a defect may be set to 5V but may be different for different applications. The control module 210 implements a detection algorithm that detects when the voltage across the terminals 223, 226 drops below one of the A/D voltage thresholds and generates a visual and/or an audible signal to flag the defect detected.

The above-described voltage and current balancing circuit minimizes current levels at all points of operation independent of whether a short is present. The inclusion, selection, and arrangement of resistors and capacitor as described prevent large swings in voltage and current and thus prevent component degradation over time. This maintains current levels below thresholds associated with perceived and/or actual harm.

FIG. 3 shows the insulation inspection system 200 inspecting an individual hairpin 300 of a stator. The insulation inspection system 200 includes the HMI 204 and voltage and current balancing circuit 206, which is connected to a power source 208. The HMI 204 may include the control module 210, the A/D converter 212, the memory 214, the transceiver 216, the display 218, and the audible device 220. The display 218 may include the LEDs 222 and/or other visual display and/or indicator elements. The voltage and current balancing circuit 206 includes resistors R1, R2 and capacitor C. The A/D converter 212 includes the input terminals 223, 226.

Resistor R1 has i) a first end connected to a first (or positive) terminal of the A/D converter 212 and to the brush 228, and ii) a second end connected to a first end of the capacitor C and to a positive terminal of the power source 208. Resistor R2 includes i) a first end connected to second (or negative) input terminal 226 of the A/D converter 212, to a second end of the capacitor, an end of the hairpin 300, and a negative terminal of the power source 208, and ii) a second end connected to a third (or common) terminal COM of the A/D converter 212. The common terminal COM is separate from and not connected to either of the terminals 223, 226. A lead 225 is connected between i) the negative terminal 226, the first end of resistor R2 and the second end of capacitor C, and ii) the one or more 3-phase contacts 224. The first end of the capacitor C is connected to the positive terminal of the power source 208. A second end of the capacitor C is connected to the negative terminal of the power source 208.

The resistors R1, R2 and the capacitor C are connected in series between the terminal 223 and the common terminal COM. In the example shown, the capacitor C is connected between the resistors R1 and R2. In an embodiment, the resistors R1 and R2 are directly connected to the terminals 223, 226 and directly connected to the capacitor C. The resistor R1 may be directly connected to the brush 228. The resistor R2 may be directly connected to the hairpin 300.

The hairpin 300 may include a conductive wire that is coated with a dielectric material (e.g., epoxy). The bristles 230 of the brush 228 may be moved along the hairpin 300 to determine if there is a portion of the conductive wire exposed through the dielectric coating or the hairpin 300 may be moved relative to the brush 228.

Figure 4:
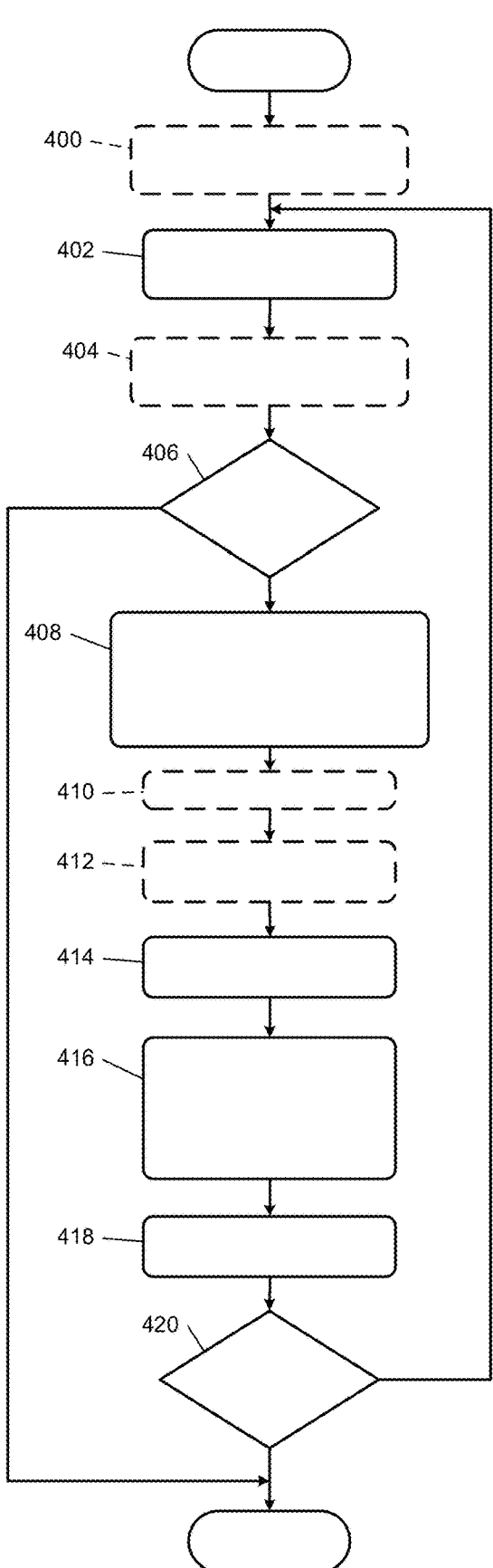
FIG. 4 illustrates an example insulation inspection method for detecting, marking, identifying and reporting defects in accordance with the present disclosure.

FIG. 4 illustrates an insulation inspection method for detecting, marking, identifying and reporting defects. The insulation inspection method implements a defect detection analysis algorithm including the following operations. The operations may be iteratively performed. Operations that are shown with solid lined boxes may be performed by the insulation inspection system 200 of FIGS. 2-3.

At 400, the lead 225 is connected to the part being inspected such as a stator of a motor, a hairpin, or other electrical component or element. For example, the lead 225 may be connected to one or more 3-phase contacts of a stator.

At 402, the control module 210 begins monitoring voltage at the input terminals 223, 226 and thus at bristles 230 of the brush 228.

At 404, the brush 228 is moved over insulated section of the part being inspected. This includes brushing the bristles 230 on the insulated section such that one or more of the bristles comes in contact with any uninsulated (exposed) conductive material of the part. The exposed conductive material being at a voltage applied by the power source 208 to the part. When one or more of the bristles 230 contacts an exposed portion of the part a short is created and the control module 210 detects the drop in voltage. The short circuit produces a sharp voltage drop below the threshold level from a nominal (or normal expected) level. The bristles maintain contact with the part while being moved relative to the part.

At 406, the control module 210 determines whether a defect has been detected. If a defect has been detected, operation 408 is performed, otherwise the method may end. A defect is detected when there is a short between one or more of the bristles 230 and an exposed conductive element of the part. When the part is a stator, a short may exist between one or more of the bristles 230 and an exposed wire of the stator and thus between the one or more bristles 230 and one or more 3-phase contacts of the stator.

At 408, the control module 210 records information regarding the defect and indicates that a defect has been detected visually and/or audibly via one or more indicators such as the display 218, the LEDs 222, and/or the audible device 220. In an embodiment, a message is displayed via the display 218. The message may include the information recorded. In another embodiment, the message is sent from the HMI 204 to another network device via the transceiver 216. This may occur at 418. The recorded information and message may include when the defect was detected, rate of drop in voltage across terminals 223, 226, how long the defect was detected, where the defect is located, etc. The defect may be detected for a short period depending on the size of the defect and the speed of movement of the brush relative to the part being inspected. The location of the defect may be indicated relative to the one or more reference points on the part being inspected. In an embodiment, a technician records the location of the defect detected subsequent to and/or upon seeing and/or hearing a message that a defect has been detected. As an example, a ring may be attached to the weld end of a stator being inspected and have clocked indices and/or a lamination stack of the stator may have reference points. The indices and/or reference points may be used to determine a location of the defect detected. In an embodiment, the control module 210 flags the defect by illuminating a red LED or displaying a red icon. In another embodiment, the control module 210 flags the defect by initiating an audible defect alarm signal.

At 410, the detected defect may be marked. As an example, a technician may physically mark the defect using a marker. If the brush 228 and/or bristles are in the way for marking the defect, operation 410 may be performed subsequent to operation 412.

At 412, the brush 228 is removed from the part. At 414, the voltage of the voltage and current balancing circuit 206 returns to the nominal level.

At 416, the control module 210 stops indicating that a defect has been detected and returns the one or more indicators back to normal states. For example, the audible device 220, which may be providing the audible message (or alarm), turns off. The illuminated LED turns green or off. The displayed red icon is replaced with a green icon or is no longer displayed.

At 418, the control module 210 may report a defective zone where the defect is located and/or other related information (e.g., any of the information stated above) on the display 218, via the audible device 220, and/or to a network device remotely located from the HMI 204 via the transceiver 216. This may include an indication of the location of the defect on the part, the time the defect was detected, and/or other information indicative of the location of the defect.

At 420, the control module may determine if there is more of the part to inspect. If yes, operation 402 may be performed, otherwise the method may end.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An insulation inspection system comprising:
a set of input terminals;
a brush;
a circuit connected to the set of input terminals, the brush, and a part being inspected, wherein the circuit comprises at least one of a pair of resistors and a capacitor; and
a control module configured to detect that a short circuit exists between a conductive element of the part and one or more conductive bristles due to insulative material missing on the part and as a result the one or more conductive bristles of the brush contacting the conductive element of the part.

2. The insulation inspection system of claim 1, wherein:
the set of input terminals comprises a positive terminal and a negative terminal; and
the capacitor and a first resistor of the pair of resistors is connected in series between the positive terminal and the negative terminal.

3. The insulation inspection system of claim 2, wherein:
the set of input terminals comprises a common terminal separate from the positive terminal and the negative terminal; and
a second resistor of the pair of resistors is connected between the negative terminal and the common terminal.

4. The insulation inspection system of claim 1, wherein:
the set of input terminals comprises a positive terminal, a negative terminal and a common terminal;
the circuit is implemented as a voltage and current balancing circuit and comprises the pair of resistors and the capacitor connected in series between the positive terminal and the common terminal;
a first resistor of the pair of resistors and the capacitor are connected in series between the positive terminal and the negative terminal; and
a second resistor of the pair of resistors is connected between the negative terminal and the common terminal.

5. The insulation inspection system of claim 4, wherein the capacitor is connected across a power source and between the positive terminal and the negative terminal.

6. The insulation inspection system of claim 5, wherein:
the first resistor comprises i) a first end connected to a first end of the capacitor, and ii) a second end connected to a first one of the set of input terminals and to the brush; and
the second resistor comprises i) a first end connected to a second one of the set of input terminals, to a second end of the capacitor, and to the part, and ii) a second end connected to a third one of the set of input terminals.

7. The insulation inspection system of claim 6, wherein:
the first end of the capacitor is connected to a positive terminal of the power source; and
the second end of the capacitor is connected to a negative terminal of the power source.

8. The insulation inspection system of claim 6, wherein a lead is connected between i) the second one of the set on input terminals, the first end of the second resistor and the second end of the capacitor, and ii) one or more 3-phase contacts of the part.

9. The insulation inspection system of claim 1, further comprising an analog-to-digital converter connected to the circuit and configured to convert an analog signal output from the circuit to a digital signal,
wherein the control module is configured, based on the digital signal, to detect when a short circuit exists between the conductive element of the part and the one or more conductive bristles.

10. The insulation inspection system of claim 1, wherein the control module is configured to generate at least one of a message or an alarm when a short circuit between the conductive element of the part and the one or more conductive bristles is detected.

11. The insulation inspection system of claim 1, wherein the part is a stator of a motor or a hairpin.

12. The insulation inspection system of claim 1, wherein the conductive element is an electrical contact of a motor or a wire of a stator of the motor.

13. The insulation inspection system of claim 1, wherein the brush is arranged relative to the part such that the one or more conductive bristles brush the part.

14. The insulation inspection system of claim 1, wherein the control module is configured to monitor the set of input terminals and detect that the short exists based on a voltage at the set of input terminals.

15. An insulation inspection method comprising:
connecting a lead to a part to be inspected;
moving a brush across a portion of the part or moving the part relative to the brush;
detecting via a circuit a drop in voltage across a set of input terminals, wherein the circuit is connected to the set of input terminals, the brush, and the part, and wherein the circuit comprises at least one of a pair of resistors and a capacitor; and
determining whether the drop in voltage is indicative that a short circuit exists between a conductive element of the part and one or more conductive bristles of the brush due to insulative material missing on the part and as a result the one or more conductive bristles of the brush contacting the conductive element of the part.

16. The insulation inspection method of claim 15, wherein:
the set of input terminals comprises a positive terminal and a negative terminal; and
the capacitor and a first resistor of the pair of resistors is connected in series between the positive terminal and the negative terminal.

17. The insulation inspection method of claim 15, wherein:
the set of input terminals comprises a positive terminal, a negative terminal and a common terminal;
the circuit is implemented as a voltage and current balancing circuit and comprises the pair of resistors and the capacitor connected in series between the positive terminal and the common terminal;
a first resistor of the pair of resistors and the capacitor are connected in series between the positive terminal and the negative terminal; and a second resistor of the pair of resistors is connected between the negative terminal and the common terminal.

18. The insulation inspection method of claim 17, wherein a lead is connected between i) a second one of the set of input terminals, a first end of the second resistor and a second end of the capacitor, and ii) one or more 3-phase contacts of the part.

19. The insulation inspection method of claim 15, further comprising:

converting an analog signal output from the circuit to a digital signal via an analog-to-digital converter, wherein the analog-to-digital converter is connected to the circuit; and based on the digital signal, detecting when a short circuit exists between the conductive element of the part and the one or more conductive bristles.

20. The insulation inspection method of claim 15, further comprising generating at least one of a message or an alarm when a short circuit between the conductive element of the part and the one or more conductive bristles is detected.

* * * * *